STRIP-LINE POWER TRANSISTOR PACKAGE

Filed March 13, 1968 2 Sheets-Sheet 1

INVENTOR
DONALD R. CARLEY
BY W. S. Hill
AGENT

INVENTOR:
DONALD R. CARLEY
BY W. S. Hill
AGENT

United States Patent Office 3,478,161
Patented Nov. 11, 1969

3,478,161
STRIP-LINE POWER TRANSISTOR PACKAGE
Donald R. Carley, Somerville, N.J., assignor to RCA Corporation, a corporation of Delaware
Filed Mar. 13, 1968, Ser. No. 712,736
Int. Cl. H05k 5/06
U.S. Cl. 174—52 6 Claims

ABSTRACT OF THE DISCLOSURE

A hermetically-sealed, radial-lead strip-line package for transistors operating in the VHF and UHF bands. The package includes a ceramic header with one metallized portion to which the collector electrode of the transistor is soldered. A ribbon-type emitter lead is brazed to another metallized portion of the header. A second ceramic member separates the emitter lead from the base and collector leads which are brazed to the top of the ceramic member. The collector current path extends from the metallized area on the header through the second ceramic member to the collector lead.

BACKGROUND OF THE INVENTION

Many circuit applications require the operation of transistors at frequencies in the thousands of megahertz range. At these high frequencies, ordinary transistor packages become unusable. Metal cans, metal headers and other parts in conventional transistor packages used for supporting the transistor or making connections to the semiconductor device, introduce inductances and capacitances, as well as losses, that degrade circuit stability and performance and produce resonant frequencies seriously interfering with proper circuit operation.

Previously, various attempts have been made to provide transistor packages usable in strip-line circuits at very-high and ultra-high frequencies. Some of these packages have utilized flat ribbon-type leads in order to reduce parasitic inductances, but these packages generally have not been hermetic. Consequently, the devices have been subject to deterioration due to atmospheric influences. Where hermeticity was required, the leads of these packages have been of the usual round variety, but these have introduced undesirable inductance. Another undesirable feature of the previous transistor packages for use in VHF and UHF circuits has been their fragility.

OBJECTS OF THE INVENTION

An object of the present invention is to provide an improved strip-line transistor package with good hermeticity but at the same time having ribbon-type leads.

Another object of the invention is to provide an improved strip-line transistor package with good power dissipation capabilities.

A further object of the present invention is to provide an improved strip-line transistor package which is rugged in construction but is also low in cost.

SUMMARY OF THE INVENTION

The semiconductor device mount of the invention includes an insulating header adapted to support the device and having a surface to which a first ribbon-shaped one of the device electrodes is joined. A ceramic member, attached to the header surface, has an opening for accommodating the device. To the top surface of the ceramic member two other device electrode leads are attached and a conducting path extends from one of these leads through the ceramic member to one of the device electrodes. The opening in the ceramic member is sealed with a cap.

THE DRAWING

Figure 5:
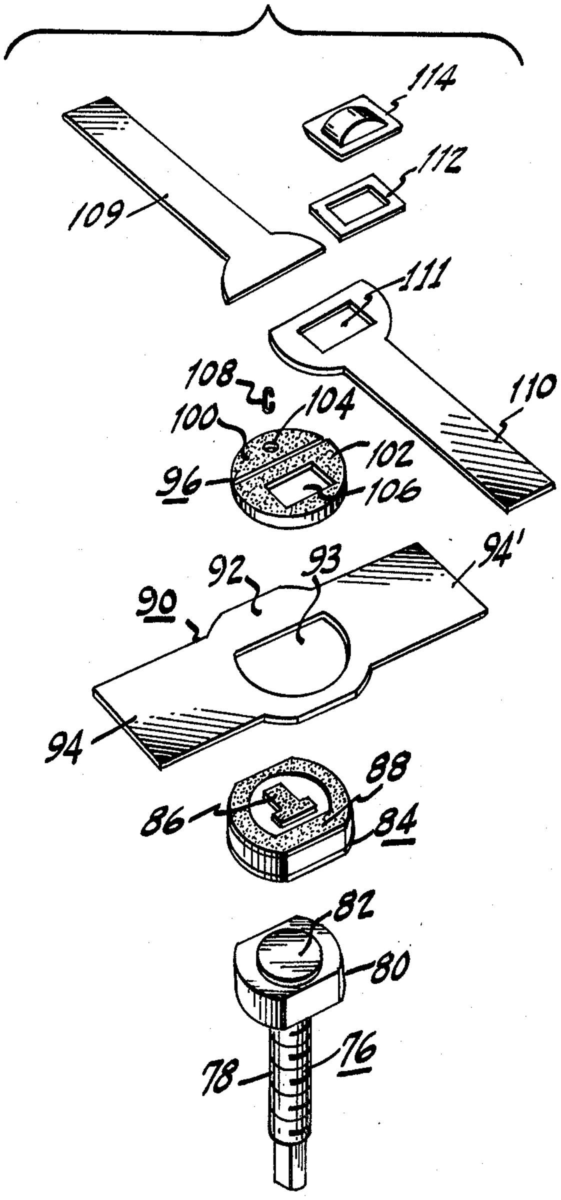
Figure 6:
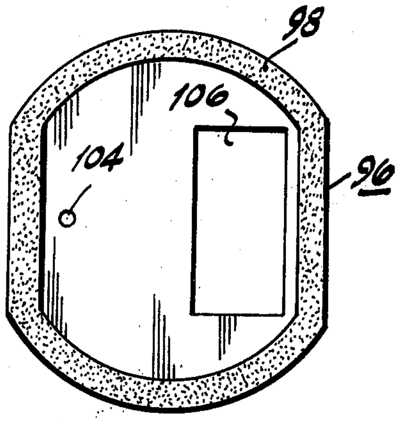

FIGRE 5 is an exploded view of the parts of a transistor package in accordance with a second embodiment of the invention, and FIGURE 6 is a bottom view of the disc 96 shown in FIGURE 5.

DESCRIPTION OF THE INVENTION

Figures 1, 2, 3:
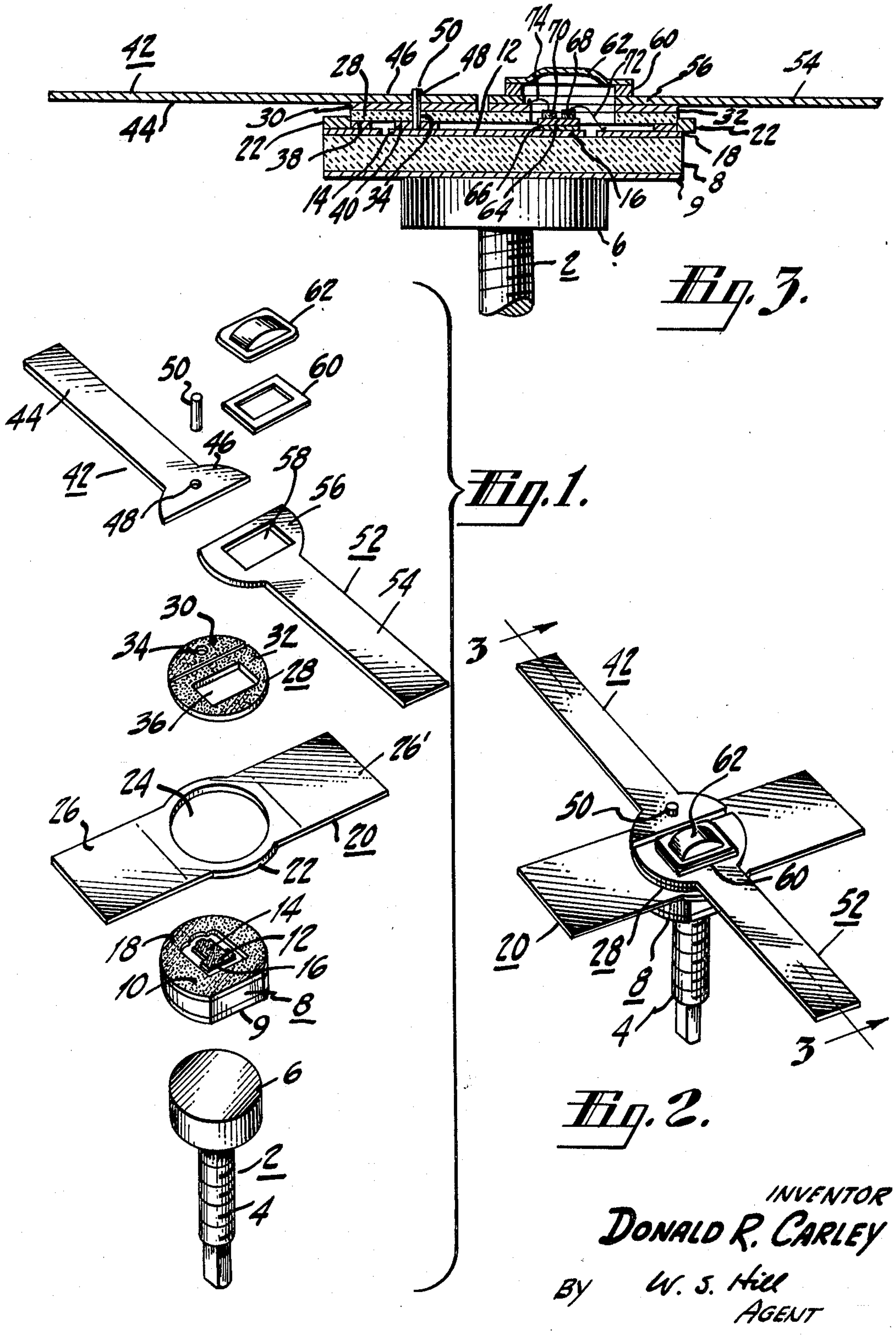
FIGURE 1 is an exploded view of the various parts which comprise one embodiment of the package of the present invention.
FIGURE 2 is a perspective view of the assembled package.
FIGURE 3 is a section view taken along the line 3—3 of FIGURE 2.

As illustrated in FIGURE 1, a transistor package in accordance with the present invention may be mounted on a metal mount stud 2 having a threaded shank portion 4 and a platform portion 6. It will be understood that this part has been included for purposes of illustrating how the package may be mounted but it is not an essential part of the present invention.

One embodiment of a package of the present invention includes a ceramic header member 8 in the form of a flat disc which may have a cutaway portion for convenience in indexing. The disc 8 has a lower surface with a metal coating 9 over-all in order to adapt it to be sealed to the top of platform portion 6 of the mounting stud (FIGURE 3). The disc also has a top surface 10 which includes a first metallized portion 12 which is centrally disposed on the surface 10 and has a tongue-like portion 14 and a widened base portion 16. As will be explained in more detail later, a transistor may be mounted on the widened portion 16 and the tongue-like extension 14 serves as part of the current path to an electrode lead. The surface 10 also has a second metallized portion 18 around the periphery thereof.

The package also includes an emitter lead member 20 which has a widened central portion 22 having a circular opening 24 therein. Extending from the central portion 22 are two radially-extending wings 26 and 26'. The wings 26 and 26' are flattened and ribbon-like in structure. The emitter lead 20 is adapted to be sealed to the metallized portion 18 of the header 8 such that the long axis of the wings 26 and 26' is at right angles to the long axis of the tongue portion 14 of the header 8. The opening 24 is dimensioned such that the lead does not touch the metallized portion 12 on the disc.

The package also includes a second ceramic disc 28 which is somewhat thicker than the emitter lead 20 and is dimensioned to fit snugly within the emitter lead opening 24. On the top surface of the disc 28 are a first metallized portion 30 and a second separate metallized portion 32. A small hole 34 extends through the disc 28 between its upper and lower surfaces in that portion of the disc covered by the metallized portion 30. A larger rectangular-shaped opening 36 extends through the disc 28 in that portion of the disc covered by the metallized portion 32. The opening 36 is dimensioned so that a portion of the metallized area 18 adjacent the metallized portion 16 on header 8 is exposed when the disc 28 is an place (FIGURE 3).

Figure 4:
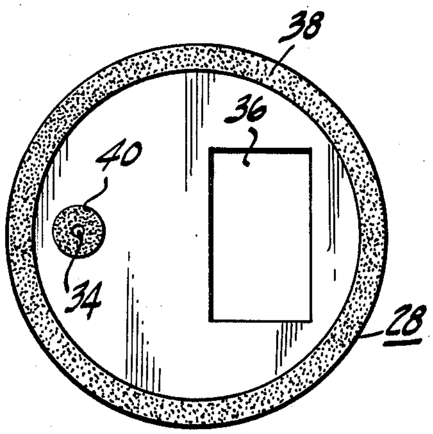
FIGURE 4 is a bottom view of the disc 28 shown in FIGURE 1.

A bottom view of the disc 28 is shown in FIGURE 4. As shown in FIGURE 4, the bottom of the disc 28 has a peripheral metallized portion 38 and a second smaller metallized portion 40 surrounding the hole 34. The metallized portion 38 enables the disc to be sealed to the ceramic header 8 and the metallized portion 40 is adapted to make electrical contact to the tongue-shaped metallized portion 14 on the top surface of the header 8.

The package further includes a collector lead 42 of ribbon-like structure which includes a shank portion 44 and a widened end portion 46. The bottom surface of the end portion 46 is adapted to be brazed to the metallized portion 30 of the disc 28. The collector lead 42 also has a hole 48 therein which should be lined up with the hole 34 in the disc 28. A metal pin 50 is adapted to extend through the holes 48 and 34 in the collector lead 42 and the ceramic disc 28, respectively, and make electrical connection to the metallized tongue portion 14 on the top surface of the ceramic header member 8 (FIGURE 3).

Also included in the package is a base lead 52, also of ribbon-like structure and having a shank portion 54 and a widened end portion 56. The end portion 56 includes a rectangular-shaped opening 58. The bottom surface of the end portion 56 is adapted to be sealed to the metallized portion 32 of the disc 28 such that the opening 58 is aligned with the opening 36 in the disc.

The opening 36 in the disc 28 and the opening 58 in the base lead 52 comprise a well for accommodating the transistor which is to be packaged. After the transistor has been mounted in the package, the top opening of the well is sealed, using a thin rectangular frame-shaped metal preform 60 adapted to fit around the periphery of the opening 58 in the base lead 52 and a cap member 62 dimensioned to cover the opening 58 and be sealed thereto by brazing.

The manner in which a transistor may be mounted with the package will now be explained.

A transistor 64 (FIGURE 3) is centrally positioned on the metallized portion 16 of the header 8 and has its collector electrode 66 soldered thereto. On the top of the transistor are an emitter electrode 68 and a base electrode 70. The emitter electrode 68 is connected wtih a wire 72 to the closest adjacent part of the metallized portion 18 of the ceramic header 8. The base electrode 70 is connected with a wire 74 to the closest adjacent portion of the metallized area 32 on top of the ceramic disc 28.

As shown in FIGURE 3, the current path from the collector electrode 66 extends through metallized tongue portion 14 through the pin 50 and the parts 46 and 44 of the collector lead 42.

A somewhat different embodiment of the package of the present invention is illustrated in the exploded view of FIGURE 5. The package is intended to be mounted on a metal stud 76 having a threaded shank portion 78 and a platform portion 80 which has a second recessed platform portion 82 on the top surface thereof. The recessed platform portion 82 is to improve the voltage breakdown of the device and also to improve mechanical strength of the assembled package.

On top of the platform portion 82 is mounted a ceramic header 84 which has about the same dimensions as the metal platform 80. Both the metal platform 80 and the header 84 are of generally circular shape, but have cutaway portions on opposed sides of the periphery.

The top of the header 84 has metallized portions 86 and 88 having the same function as the corresponding metallized portions of the previous embodiment of the invention. To the peripheral metallized portion 88 of the header 84 is sealed the bottom surface of the central part of an emitter lead 90 which has a central peripheral portion 92 and wing portions 94 and 94'. In this embodiment, the peripheral portion 92 is extended further inward toward the center of the opening 93 so that the transistor emitter wire can be bonded thereto. In the previous embodiment, the emitter wire was bonded to a metallized portion on the header.

On the top peripheral portion 92 of the emitter lead 90 is mounted the bottom surface of a ceramic disc 96. It will be noted that in this embodiment the ceramic disc rests on the top of the emitter lead instead of being inserted within the opening of this lead as in the previous embodiment. As shown in FIGURE 6, the bottom surface of the disc 96 has a peripheral metallized portion 98 which is slightly raised from the rest of the surface of the disc in order to facilitate good sealing of the metallized portion 98 to the emitter lead.

Referring back to FIGURE 5, the top portion of the disc 96 has metallized portions 100 and 102. A small hole 104 extends through that portion of the disc 96 covered with the metallized portion 100 and emitter opening 106 which is rectangular in shape and extends through the portion of the disc 96 covered with the metallized layer 102.

In this embodiment an electrical connection is made through the ceramic disc 96 by means of a very small C-shaped spring 108 which is forced into the hole 104 so that it projects out the bottom of the hole and makes contact to the metallized portion 86 on the header. The top of the spring 108 projects slightly above the top surface of the disc 96 so that when the collector lead 109 is sealed to the metallized portion 100, the spring 108 makes electrical contact therewith. When the collector lead 109 is sealed to the disc 96 the base lead 110 is also sealed to the metallized portion 102 of the disc 96.

As in the previous embodiment, assembly is completed using a metal preform 112 and a metal cap 114 to close the top of the rectangular opening 111 in the base lead.

In both of the embodiments shown, the emitter and base leads may be interchanged.

The various areas of the ceramic discs which require the metallization may have these metallized areas applied by spraying a molybdenum-manganese solution through a mask to first deposit a thin molybdenum-manganese metal layer which adheres well to the ceramic, and then plating the initial metal layer with silver. The ceramic discs may be made of beryllium oxide or aluminum oxide. The metallization on the ceramics may also be done by plating silver on tungsten.

To mount the ceramic header to the metal stud, the top of the stud may first be nickel-plated and then the ceramic, metallized on the bottom, may be brazed to the nickel plating.

Among the advantages of the device packages of the present invention are:

(a) Low cost of assembly; only one brazing preform is required; the ceramic parts that are brazed have metal coatings in the brazing areas;

(b) High power dissipation capabilities;

(c) Ruggedness; and (d) Good hermetic seal although the leads are ribbon-shape.

What is claimed is:

1. A mount for a semiconductor device having a plurality of electrodes comprising:

(a) an insulating header member adapted to support said device, said header having a major surface with two separate metallic portions for connecting device electrodes thereto, (b) a ribbon-like lead sealed to one of said metallic portions, said lead having an opening therein exposing a portion of said header surface, (c) a ceramic member which is thicker than said ribbon-like lead, disposed within said opening and having a lower surface attached to said header, said member having an opening therein for accommodating said device, said member also having an upper surface with two separate conducting areas thereon, (d) device electrode means connected to each of said areas, (e) conducting means extending through said ceramic member connecting one of said last-mentioned electrode leads to one of said metallic portions of said header, and (f) a cap member sealed over said opening in said ceramic member.

2. A mount for a semiconductor device having at least three electrodes, comprising:

(a) an insulating header member adapted to support said device and having an upper surface, (b) a ribbon-like lead for a first one of said device electrodes sealed to said surface, (c) a ceramic member attached to said surface and having an opening therethrough for accommodating said device, said member having a top surface, (d) leads for another two of said device electrodes separately connected to said top surface of said ceramic member, (e) means providing a conducting path from one of said last-mentioned leads through said ceramic member to one of said device electrodes, and (f) means for sealing said opening.

3. A mount according to claim 2 in which said header member is a ceramic disc and said upper surface has a metallized area part of which is adapted to be joined to an electrode of said device and another part of which serves as part of said conducting path.

4. A mount according to claim 2 in which said ribbon-like lead includes two wings extending outwardly from said header in opposite directions.

5. A mount according to claim 2 in which said top sur face of said ceramic member has two separate metallized areas each adapted to be joined to one of said two last-mentioned leads.

6. A mount for a semiconductor device having at least three electrodes comprising:

(a) an insulating header member adapted to support said device, said header having a major surface with first and second metallized portions for connecting device electrodes thereto, (b) a ribbon-like lead for one of said device electrodes, said lead having an opening therein exposing a portion of said header surface which includes said first metallized portion and being sealed to said second metallized portion around the periphery of said opening, (c) a ceramic member sealed to said lead, said member having an opening therein for accommodating said device, and having an upper surface with two separate conducting areas thereon, (d) device electrode means connected to each of said areas, (e) conducting means extending through said ceramic member connecting one of said last-mentioned electrode leads to said first metallized portion of said header, and (f) means sealing said opening in said ceramic member.

References Cited

UNITED STATES PATENTS

| | | |
|---|---|---|
| 2,985,806 | 5/1961 | McMahon et al. |
| 2,999,964 | 9/1961 | Glickman. |
| 3,274,456 | 9/1966 | Pittler et al. |

LEWIS H. MYERS, Primary Examiner

D. A. TONE, Assistant Examiner

U.S. Cl. X.R.

317—234